US010046662B2

(12) United States Patent
Saint-Marcoux et al.

(10) Patent No.: US 10,046,662 B2
(45) Date of Patent: Aug. 14, 2018

(54) MANAGING THE CHARGING OF A BATTERY

(71) Applicant: RENAULT S.A.S., Boulogne-Billancourt (FR)

(72) Inventors: Antoine Saint-Marcoux, Palaiseau (FR); Masato Origuchi, Rambouillet (FR); Ana-Lucia Driemeyer-Franco, Montigny-le-Bretonneux (FR); Daniel Boiron, Voisins-le-Bretonneux (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 0 days.

(21) Appl. No.: 15/667,295

(22) Filed: Aug. 2, 2017

(65) Prior Publication Data

US 2018/0029491 A1 Feb. 1, 2018

Related U.S. Application Data

(63) Continuation of application No. 14/768,014, filed as application No. PCT/FR2014/050277 on Feb. 13, 2014, now abandoned.

(30) Foreign Application Priority Data

Feb. 14, 2013 (FR) ..................... 13 51264

(51) Int. Cl.
*B60L 11/18* (2006.01)
*H02J 7/00* (2006.01)
(Continued)

(52) U.S. Cl.
CPC ......... *B60L 11/1857* (2013.01); *B60L 11/187* (2013.01); *B60L 11/1809* (2013.01);
(Continued)

(58) Field of Classification Search
CPC .............. B60L 11/1809; B60L 11/1857; B60L 11/1861
(Continued)

(56) References Cited

U.S. PATENT DOCUMENTS 5,994,874 A 11/1999 Hirose
7,449,865 B2 11/2008 Wang et al.
(Continued)

FOREIGN PATENT DOCUMENTS

CA 2 792 810 9/2011
WO 02 41466 5/2002

OTHER PUBLICATIONS

International Search Report dated Jul. 31, 2014 in PCT/FR14/050277 Filed Feb. 13, 2014.
(Continued)

*Primary Examiner* — Sun Lin
(74) *Attorney, Agent, or Firm* — Oblon, McClelland, Maier & Neustadt, L.L.P.

(57) ABSTRACT

Disclosed herein is an invention concerning a method for managing charging of a Li-ion battery based on at least one parameter chosen from a group consisting of a state of deterioration of the Li-ion battery and cell unbalance, the method comprising the following steps: a) determining an end-of-charge voltage value of said Li-ion battery, b) generating a control signal controlling the charging of said Li-ion battery, and c) transmitting the control signal to a charger, the control signal being generated in such a way that the Li-ion battery is charged based on the end-of-charge voltage value determined in step a), said end-of-charge voltage value being increased based on the state of deterioration of said Li-ion battery until a limit value is reached, in
(Continued)

Figure 1:
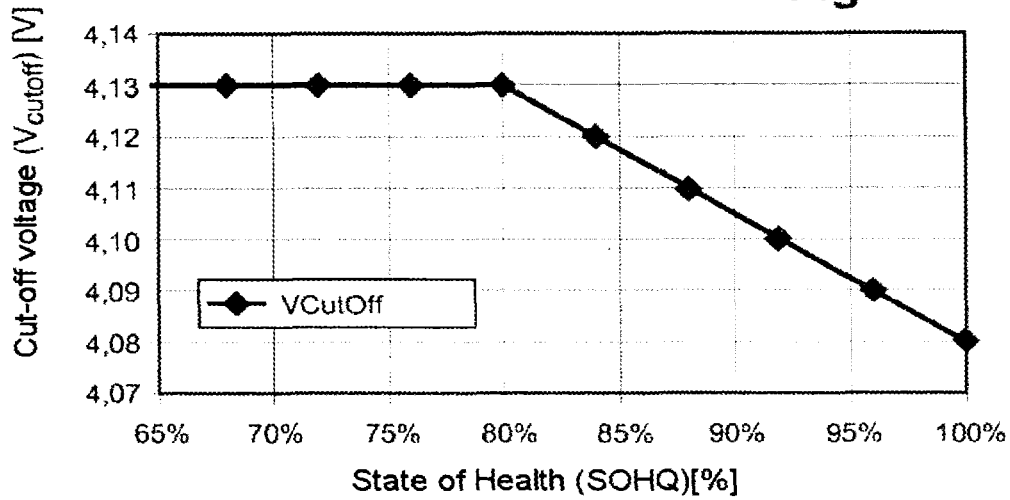

order to ensure a constant minimal level of required energy in said Li-ion battery is provided at a predetermined reference temperature.

10 Claims, 1 Drawing Sheet

(51) Int. Cl.
  *H01M 10/44* (2006.01)
  *H01M 10/0525* (2010.01)
  *G01R 31/36* (2006.01)

(52) U.S. Cl.
  CPC ....... *B60L 11/1859* (2013.01); *B60L 11/1861* (2013.01); *B60L 11/1862* (2013.01); *H02J 7/007* (2013.01); *H02J 7/0047* (2013.01); *B60L 2240/545* (2013.01); *B60L 2240/547* (2013.01); *B60L 2240/549* (2013.01); *G01R 31/3679* (2013.01); *H01M 10/0525* (2013.01); *H01M 10/44* (2013.01); *Y02E 60/122* (2013.01); *Y02T 10/705* (2013.01); *Y02T 10/7044* (2013.01)

(58) Field of Classification Search
  USPC .......................................................... 320/162
  See application file for complete search history.

(56) References Cited

U.S. PATENT DOCUMENTS

| | | |
|---|---|---|
| 7,656,131 B2 | 2/2010 | Embrey et al. |
| 2002/0075003 A1 | 6/2002 | Fridman et al. |
| 2008/0315834 A1 | 12/2008 | Cruise et al. |
| 2008/0315845 A1 | 12/2008 | Van Der Velden et al. |
| 2009/0140698 A1 | 6/2009 | Eberhard et al. |
| 2009/0140700 A1 | 6/2009 | Eberhard et al. |
| 2009/0143929 A1 | 6/2009 | Eberhard et al. |
| 2009/0167254 A1 | 7/2009 | Eberhard et al. |
| 2013/0038296 A1 | 2/2013 | Roessel |

OTHER PUBLICATIONS

French Search Report dated Nov. 8, 2013 in Application No. FR 1351264 Filed Feb. 14, 2013.

MANAGING THE CHARGING OF A BATTERY

CROSS-REFERENCE OF RELATED APPLICATION

The present application is a continuation of U.S. patent application Ser. No. 14/768,014, filed Aug. 14, 2015, which is a continuation of International Application No. PCT/FR14/050277, filed Feb. 13, 2014, and claims priority to French Patent Application No. 13-51264, filed Feb. 14, 2013, the entire contents of which are incorporated herein by reference.

BACKGROUND

The invention relates to the field of managing the charging of a battery. An example of application of the invention can be found in the automobile industry, notably for managing the charging of a traction battery of an electric and/or hybrid vehicle. This type of battery, notably of the lithium-ion type, comprises a plurality of electric accumulators, or cells, including a rechargeable electro-chemical system intended to supply a nominal voltage. They are generally controlled by a battery control system (BMS—"Battery Management System") which is an electronic system for controlling the state of the various elements or parameters of a lithium battery, and notably of its constituent cells comprising a negative electrode and a positive electrode.

A BMS system is an important element in all lithium batteries or battery assemblies comprising a battery and a BMS system. It monitors the state of various elements or parameters of the battery, such as the total voltage or that of individual cells, the temperature (average temperature, cooling liquid inlet temperature, cooling liquid outlet temperature, or temperatures of the individual cells) and the state of charge or the depth of discharge. A BMS system allows the monitoring of data, such as the maximum charging power and discharging power, the energy supplied from the last charge or the last charging cycle, the total energy used from the first use and the total operating time since the first use.

A BMS system provides protection of the battery by preventing it from operating outside of its typical operating range, and provides protection notably against overcurrent, overvoltage (during charging), undervoltage (during discharge) and also, which is particularly important for Li-ion batteries, against overheating and under-temperature.

In particular, the BMS system makes it possible to manage the charging of the battery by indicating at all times what is the maximum authorized power during charging and if the battery is fully charged or not.

For this purpose, one of the predominant parameters is the end-of-charge voltage or cut-off voltage, which can, for example, be measured at the terminals of the battery. In fact, this voltage is representative of the charge limit of the constituent cells of the battery. In other words, it is the value which the maximum voltage of each cell must reach at the end of charging in order to decide that the charging is fully completed. In Li-ion battery technology, the cut-off voltage can be between 2.5 V and 4.5 V, preferably between 3.5 V and 4.2 V. Apart from the choice of the end-of-charge voltage, the definition of a charging strategy takes on great importance because it makes it possible to seek a compromise between the durability of the battery and the charging time. For the same given end-of-charge voltage, when the authorized charging power is greatly limited, the durability is improved to the detriment of the charging time and, when a high charging power is authorized, the charging time is reduced to the detriment of the durability.

One of the difficulties is due to the fact that for a predetermined end-of-charge voltage (cut-off voltage), the energy available for a user is not the same, principally in relation to three factors:

the temperature of the battery. Thus, the lower the temperature of the battery becomes, the lower is the amount of energy that can be discharged from this cut-off voltage, because the internal resistances of the cells are higher;

the ageing of the battery. As the battery becomes more degraded ("poor state of health"), the lower becomes the amount of energy that can be discharged at this cut-off voltage, because the available capacity (in A.h) in the battery is limited. The state of ageing of the battery is defined as being the ratio between the capacity available in the battery between a zero charge state and a maximum charge state at a time t, and the capacity available in the battery between a zero charge state and a maximum charge state at the start of the service life. Therefore the ratio is 100% at the start of use of the battery.

the cell unbalance, defined as being the difference between the state of charge of the cell exhibiting the highest charge and the state of charge of the cell exhibiting the lowest charge. Thus, the greater the unbalance becomes, the lower becomes the amount of energy that can be discharged at this cut-off voltage, because the lowest cell will reach its end of discharge voltage limit (minimum charge level) much earlier than the other cells.

These factors compete against increasing the end-of-charge voltage in order to make it possible to provide a sufficient energy level to a user.

Conversely, the higher the end-of-charge voltage becomes, the more the battery is used in an operating range where it degrades rapidly. More energy is certainly available at the start of the service life but, after several months or years, the ageing of the battery will be accentuated in an unacceptable manner for the user, and an increase of the end-of-charge voltage will not be sufficient to compensate for the loss of capacity.

In terms of provision of services, the battery, comprising the cells and the BMS system, must provide a minimum required energy level, not only at the start of its service life but also after a certain number of years.

A problem to be solved relative to the BMS system is the definition of an end-of-charge strategy which makes it possible (i) at the start of the service life, to provide a minimum required energy level despite a cell unbalance on leaving the factory (or production line) greater than foreseen because of the manufacturing process and (ii), over the years of use of the vehicle, to fully compensate for the loss of energy in the battery.

In order to provide a user with an energy level equal to or slightly higher than the minimum required energy level, an accepted solution consists of choosing an end-of-charge voltage which is fixed and determined, in the following conditions: a reference temperature fixed, for example at 25° C., a given ageing level of the battery, for example at the start of the service life, a nominal level of unbalance, for example less than 3% of unbalance between the most charged cell and the least charged cell.

On the other hand, in cases other than those mentioned above, the energy effectively available to the user is lower than what is expected.

Conversely, if the cell unbalance is substantially lower than the nominal unbalance, which can also be the case on leaving the factory, then there will be more energy available than is strictly necessary. This is not desirable, because this amounts to using the battery over a larger operating range than what is necessary, which results in loss of capacity after several years of use.

Numerous patents explicitly describe the principle of CC-CV—Constant Current (CC) first, followed by charging whilst regulating with respect to a reference voltage (CV), such as the document WO2012 074406 A2, and which makes it possible to choose different charging algorithms in the BMS system, as a function of the conditions, such as the temperature, the electric mains (cost of the current) and of the actual type of charger. This logic makes it possible to charge the battery up to a desired energy level in nominal conditions. However, it does not, by itself, make it possible to manage all the causes of "dispersion", such as the cell unbalance, the temperature of the battery, and the ageing of the battery.

The aim of the invention is to solve at least one of the above disadvantages. In particular, a purpose of the invention is to propose a method of managing charging making it possible to provide a minimum required energy level, whilst limiting the degradation of the battery.

The invention therefore relates to a method for managing the charging of a Li-ion battery as a function of at least one parameter chosen from the group comprising the ageing of the battery and the cell unbalance representing the difference between the state of charge of the cell exhibiting the highest charge and the state of charge of the cell exhibiting the lowest charge, comprising the following steps of:

a) determining an end-of-charge voltage value of said battery,
b) generating a control signal controlling the charging of said battery and of transmitting the control signal to a charger, the control signal being generated such that the battery is charged as a function of the end-of-charge voltage value determined in step a), said end-of-charge voltage value being increased as a function of the state of ageing of said Li-ion battery until a limit value is reached in order to ensure a constant minimum required energy level in said Li-ion battery, for a predetermined reference temperature.

According to the invention, it is therefore possible to provide the user with a Li-ion battery offering a minimum required energy level, for example of between 18 kWh and 22 kWh, moreover being constant, for a given reference temperature, for example 25° C., typically in the range 15° C.-40° C. and advantageously to do this for the longest permitted period of use, whilst avoiding the use of the battery in a voltage range that is too wide resulting in its premature degradation. It is thus possible to take into account the ageing of the battery and/or the cell unbalance in order to vary the end-of-charge voltage in order to ensure the minimum required energy level of the battery.

The more degraded the battery becomes ("poor state of health"), the lower becomes the amount of energy that can be discharged at this cut-off voltage, because the available capacity (in A.h) in the battery is limited, and this is the reason why the cut-off voltage must be increased and fixed for charging.

By way of example, at the start of the service life of the battery or, in other words, for zero ageing or a 100% state of health, the cut-off voltage can have a value equal to 4.08 V for each of the constituent cells of the battery, it being possible to increase this value and fix it for example at 4.11 V when the state of health of the battery is about 88%, and for example fixed at 4.13 V when the state of health of the battery is between 80% and 65%.

The method of the invention can be used advantageously by a BMS battery control system, which comprises a computer containing instructions for determining the charging voltage of said battery (step a)) and deciding to increase this value as a function of the increasing state of ageing of the battery.

In the context of the invention, the term "signal", is equally understood to be an electric, differential or other kind of signal, such as an electromagnetic signal.

Step a) can advantageously comprise a step of generating a signal for determining the end-of-charge voltage value of said battery, said signal making it possible to determine the end-of-charge voltage value.

The method can advantageously comprise, prior to step a), a step of generating and processing a signal of evaluation of the state of ageing of the battery.

This step can be implemented by several methods known to those skilled in the art. It can be a matter of characterizing the internal resistance of the battery or of estimating the total available capacity in the battery. An example of a method is described in WO 2007/004817A1.

Preferably, the method can comprise, after step b), a step of generating and processing an end-of-charge signal when the maximum cell voltage value ($V_{cell}^{max}=\max(V_{cell}^i, i \in 1 \ldots N)$) is greater than or equal to the end-of-charge voltage value ($V_{EndOfCharge}^{cut-Off}$) and when the authorized charging power in the battery (PCHG) is less than or equal to the maximum authorized end-of-charge power ($P_{EndOfCharge}^{Threshold}$).

The end-of-charge can typically be signaled by an indicator operating according to a Boolean system.

Typical values for the end-of-charge voltage can be between 4.08 and 4.15 V and for the maximum authorized end-of-charge power; these values can be equal to 1 kW.

The importance of this aspect may not be so much due to the fact that the voltage of the battery is higher than a threshold, but that this is the case for a low current level (typically 2 A). This is the advantage of this double condition on the authorized charging power and the maximum cell voltage. In fact, the objective of a charging strategy is to ensure that the open circuit voltage (OCV) is correctly at a desired voltage level. However, what is measured is the cell voltage, which can differ from the open circuit voltage for a cell i of the battery ($OCV_{cell}^i$) by the expression: $DCR_{cell}^i \cdot I_{Bat}$, where $DCR_{cell}^i$ is the internal resistance of the cell i (Ohm) and $I_{Bat}$ is the value of the current that passes through the battery (A).

Thus, the lower the authorized charging power becomes, the lower the input current $I_{Bat}$ of the battery can become and, consequently, the more the cell voltage $V_{cell}^i$ can advantageously be a good indicator of the $OCV_{cell}^i$.

Moreover, the fixing of a condition on the maximum cell voltage, instead of the minimum cell voltage or the average cell voltage, can make it possible to ensure the control of the voltage of all of the cells, and that none of them will exceed this predefined threshold.

As long as the cell unbalance remains below the nominal unbalance level, typically at most 20 mV, this cut-off voltage can advantageously make it possible to ensure the constant minimum required energy level for the user. On the other hand, if the cell unbalance exceeds the nominal end-of-charge unbalance, then this cut-off voltage cannot make it possible to ensure the constant minimum required energy level for the user.

According to advantageous embodiments, the method can furthermore comprise, in step b), a step c) of generating and processing a modulation signal of said end-of-charge voltage as a function of the cell unbalance.

In this case, managing the charging of the battery can include not only the strategy mentioned above, but this management can also take account of the cell unbalance.

According to this embodiment, step a) can advantageously consist of determining the cut-off voltage for the end-of-charge on the maximum cell voltage ($V_{EndOfCharge}^{cut-Off-MAX}$) and the cut-off voltage for the end-of-charge on the minimum cell voltage ($V_{EndOfCharge}^{cut-Off-MIN}$) as a function of the state of ageing of the battery.

According to this embodiment, the method can advantageously comprise, after step c), a step of receiving and processing an end-of-charge signal when the authorized charging power in the battery (PCHG) is less than or equal to the maximum authorized end-of-charge power ($P_{EndOfCharge}^{Threshold}$) and when the maximum cell voltage value ($V_{cell}^{max}=\max(V_{cell}^{i}, i\in 1 \ldots N)$) is greater than or equal to the end-of-charge cut-off voltage on the maximum cell voltage ($V_{EndOfCharge}^{cut-Off-MAX}$) or when the value of the minimum cell voltage ($V_{cell}^{min}=\min(V_{cell}^{i}, i\in 1 \ldots N)$) is greater than or equal to the end-of-charge cut-off voltage on the minimum cell voltage ($V_{EndOfCharge}^{cut-Off-MIN}$).

Insofar as it is the lowest cell voltage which is limiting in order to ensure the minimum required energy level in the battery, it can be necessary for the minimum cell voltage to be greater than (or equal to) a predetermined threshold. However, in order to endure optimum durability of the battery, it is usually appropriate to stop charging as soon as the maximum cell voltage exceeds another additional threshold, such as defined above.

The authorized charging power can be calculated in several ways known to those skilled in the art.

By way of non-limiting example, the following variables are defined:

$$P_{CHG}^1 = \frac{\{V_{cell}^{Cut-off-MAX} - \max(OCV_{cell}^i, i \in 1 \ldots N)\}}{\max(DCV_{cell}^i, i \in 1 \ldots N)} \cdot V_{cell}^{Cut-off-MAX} \cdot N$$

$$P_{CHG}^2 = \frac{\{V_{cell}^{Cut-off-MIN} - \min(OCV_{cell}^i, i \in 1 \ldots N)\}}{\max(DCV_{cell}^i, i \in 1 \ldots N)} \cdot V_{cell}^{Cut-off-MIN} \cdot N$$

According to a first example, the authorized charging power is calculated by the following formula:

$PCHG=\min\{P_{CHG}^1, P_{CHG}^2\}$

According to a second example, the authorized charging power is limited as soon as the maximum cell voltage $V_{cell}^{max}$ is greater than or equal to a voltage threshold. This voltage threshold can for example be equal to $$V_{lim} = \frac{V_{cell}^{Cut-off-MIN} + V_{cell}^{Cut-off-MIN}}{2}$$

In practice, it is for example possible to determine the authorized charging power by the following formula:

$$PCHG = \begin{cases} \min\{P_{CHG}^1, P_{CHG}^2\}, \text{ if } V_{cell}^{max} \leq V_{lim} \\ 0.5 \times \min\{P_{CHG}^1, P_{CHG}^2\}, \text{ if } V_{cell}^{max} > V_{lim} \end{cases}$$

The advantage of the last two examples of power and of voltages is that the latter can make it possible to retain the durability of the cell by limiting the authorized charging power a little more as soon as the maximum cell voltage exceeds the cut-off voltage $V_{lim}$.

According to this embodiment, when the cell unbalance is less than the nominal cell unbalance, typically at most 20 mV, it is possible to provide the constant minimum required energy level, whilst reducing the maximum end-of-charge cell voltage, that is to say that this value of said voltage can be at the value of said voltage obtained when only the ageing threshold is taken into account.

Moreover, if the cell unbalance is greater than the nominal unbalance, without however exceeding ($V_{EndOfCharge}^{cut-Off-MAX}-V_{EndOfCharge}^{cut-Off-MIN}$), then it is possible to ensure the constant minimum required energy level in the battery. In particular, this solution makes it possible to manage the cell unbalance which could appear on leaving the factory.

In the case where the cell unbalance exceeds ($V_{EndOfCharge}^{cut-Off-MAX}-V_{EndOfCharge}^{cut-Off-MIN}$), it is in any case impossible to provide the minimum required energy level.

The advantages of this embodiment are as follows. It can make it possible, on the one hand, to ensure, over the first years of use, typically 0-3 years, the constant minimum required energy level, for the user of the battery, as long as the cell unbalance remains below the nominal unbalance and, on the other hand, to limit the degradation of the battery at the start of the service life by limiting its range of use.

By way of non-limiting examples according to the prior art and according to the invention, the following values, $V_{EndOfCharge}^{cut-Off}=4.08V$ and the nominal cell unbalance=20 mV, are considered for a 100% state of health of the battery (new battery).

In other words, $V_{EndOfCharge}^{cut-Off}$ has been fixed to ensure 22 kWh of energy available in the battery, for a nominal unbalance of 20 mV, that is to say: $V_{cell}^{min}=4.06V$.

$V_{EndOfCharge}^{cut-Off-MAX}=4.10V$ and $V_{EndOfCharge}^{cut-Off-MIN}=4.06V$ are also considered.

a) if the cell unbalance is such that: $\Delta V_{cell}=10$ mV, then:

According to the prior art, the charging of the battery is stopped at $V_{cell}^{max}=4.08V$ (and $V_{cell}^{min}=4.07V$). The user will have more than 22 kWh of available energy and the battery will have been uselessly overcharged.

According to the invention, the charging of the battery is stopped at $V_{cell}^{max}=4.07V$ (and $V_{cell}^{min}=4.06V$). There will be exactly 22 kWh of available power, whilst limiting the maximum cell voltage.

b) If the cell unbalance is such that: $\Delta V_{cell}=40$ mV, then:

According to the prior art, the charging of the battery is stopped at $V_{cell}^{max}=4.08V$ (and $V_{cell}^{min}=4.04V$). The user will not have 22 kWh.

According to the invention, the charging of the battery is stopped at $V_{cell}^{max}=4.10V$ (and $V_{cell}^{min}=4.06V$). There will be exactly 22 kWh of available power, without however fixing too high a value of maximum cell voltage.

In the context of the invention, the Li-ion battery is in no way limited, and can preferably be a battery where the lithium remains in an ionic state due to the use of an insertion compound both in the negative electrode, generally graphite, and in the positive electrode, able to be cobalt oxide, magnesium oxide or iron phosphate. Among Li-ion batteries it is possible to mention the so-called "lithium metal-polymer" and "lithium-air" batteries. The Li-ion batteries of the invention can be applied in various technological fields, such as motor vehicles, computers or telecoms and can be adapted to onboard or non-onboard systems.

The method of the invention can be used by any type of charger known to those skilled in the art, notably available commercially, and the chargers are in no way limited.

The invention also relates to a device for managing the charging of a Li-ion battery as a function of at least one parameter chosen from the group consisting of the ageing of the battery and the cell unbalance representing the difference between the state of charge of the cell exhibiting the highest charge and the state of charge of the cell exhibiting the lowest charge, comprising, means of determining an end-of-charge voltage value of said battery, processing means arranged to generate a control signal for controlling the charging of said battery, means of transmitting the control signal to a charger, characterized in that the processing means are arranged so that the control signal is generated in such a way that the charging of the battery is carried out as a function of the determined end-of-charge voltage value, said end-of-charge voltage value being increased as a function of the increasing state of ageing of said Li-ion battery up to a limit value in order to provide a constant minimum required energy level in said Li-ion battery, for a predetermined reference temperature.

Such a device can in particular be adapted for the use of the above method with the different variants.

The processing means can comprise a processor core or CPU (Central Processing Unit), a processor or other means.

The transmission means can for example comprise an output pin, an output port or other means.

Advantageously, the device can furthermore comprise means of:

generating a signal for determining the end-of-charge voltage value of said battery, said signal making it possible to carry out the determination of the end-of-charge voltage value;

generating and processing a signal of evaluation of the state of ageing of the battery, generating and processing an end-of-charge signal when the maximum value of the cell voltage is greater than or equal to the end-of-charge voltage value and when the authorized charging power in the battery is less than or equal to the maximum authorized end-of-charge power, generating and processing a modulation signal of said end-of-charge voltage increased as a function of the cell unbalance.

receiving and processing an end-of-charge signal when the authorized charging power in the battery is less than or equal to the maximum authorized end-of-charge power and when the maximum cell voltage value is greater than or equal to the cut-off voltage for the end-of-charge on the maximum cell voltage or when the value of the minimum cell voltage is greater than or equal to the cut-off voltage for the end-of-charge on the minimum cell voltage.

Advantageously, the means of determining the end-of-charge voltage value of said battery can be arranged to determine the cut-off voltage for the end-of-charge on the maximum cell voltage and the cut-off voltage for the end-of-charge on the minimum cell voltage as a function of the state of ageing of the battery.

According to another aspect, the invention relates to a computer program comprising instructions for carrying out the steps of the method of the invention, when these instructions are executed by a processor.

Advantageously, this computer program can be stored in a memory of the device for managing charging.

The invention also relates to a lithium-ion battery assembly comprising a lithium-ion battery and a device for managing the charging of the battery, such as described above.

The invention also relates to a motor vehicle incorporating a lithium-ion battery and the device for managing charging and/or a battery assembly, such as described above.

Figure 2:
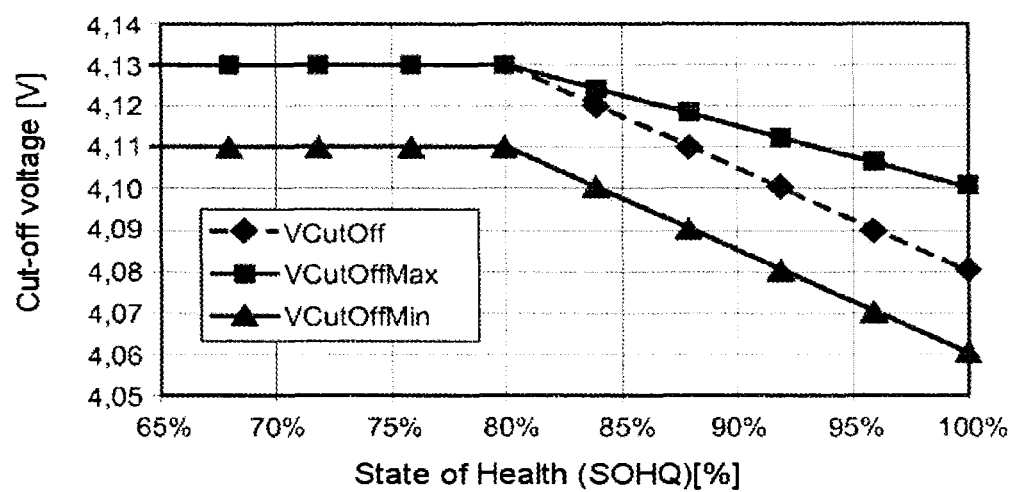
Figure 3:
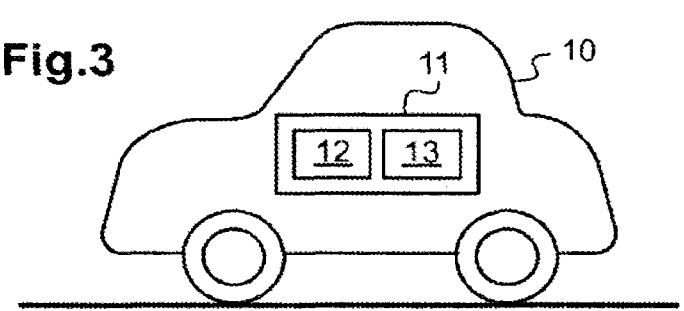

The invention is illustrated by the following figures and the non-limiting examples, in which:

FIG. 1 shows an example of a graph illustrating the end-of-charge voltage, as a function of the state of health of the Li-ion battery exhibiting a minimum energy level of 22 kWh, according to one embodiment, FIG. 2 shows an example of a graph illustrating the end-of-charge voltage, here consisting of $(V_{EndOfCharge}^{cut-Off-MAX})$ and $(V_{EndOfCharge}^{cut-Off-MIN})$ as a function of the state of health of the battery and of the cell unbalance, according to another embodiment of the invention, and FIG. 3 shows an example of a motor vehicle comprising a traction battery assembly, according to one embodiment.

FIG. 1 shows a graph illustrating the end-of-charge voltage, as a function of the state of health of the Li-ion battery exhibiting a minimum energy level of 22 kWh, according to an embodiment of the invention. This graph was established thanks to the BMS system incorporating appropriate known software.

The state of health (SOHQ) of the battery was previously determined using a computing device in the BMS system, according to conventional methods known to those skilled in the art. The cut-off voltage for a 100% state of health has a value of 4.08 V for each of the constituent cells of the battery.

FIG. 1 shows that the older the battery becomes, the more it is appropriate to increase the end-of-charge voltage in order to compensate for the loss of capacity of the battery. In other words, the end-of-charge voltage value is increased as a function of the increasing state of ageing of the battery.

FIG. 2 shows a graph illustrating the end-of-charge voltage, here consisting of the cut-off voltage for the end-of-charge on the maximum cell voltage and the cut-off voltage for the end-of-charge on the minimum cell voltage as a function of the state of health (SOHQ) of the battery, as a function, on the one hand, of the state of health of the Li-ion battery, exhibiting a minimum energy level of 22 kWh, and, on the other hand, of the cell unbalance, according to another embodiment of the invention. The values of FIG. 1 have been added in a dotted line. This graph was established using the BMS system incorporating appropriate and commercially available software.

Referring to FIG. 3, a motor vehicle 10 comprises a traction battery assembly 11, which can be charged by means of a charger (not shown), for example a charging terminal connected to the electrical supply system.

The battery 12 can for example be a lithium ion battery.

The charger can for example be a fast charging terminal supplying a DC current to the battery assembly 11 of the vehicle 10.

The battery assembly 11 can integrate a device for managing the charging 13, for example a battery control system of the BMS type, which comprises a computer program comprising instructions for determining the charging voltage value of said battery and deciding to proceed with an increase of this value as a function of the state of ageing of the battery up to a limit value making it possible to provide a constant minimum required level at a temperature of 20° C. for example.

The device for managing charging 13 comprises means of generating and receiving a signal of determination of the end-of-charge voltage value of said battery, (not shown), for example an input pin electrically connected to sensors (not shown) of the motor vehicle 10.

The device 13 comprises processing means (not shown) arranged to generate a control signal controlling the charging of said battery and in order that the control signal is generated such that the charging of the battery is carried out as a function of the end-of-charge voltage value determined in the preceding step, said end-of-charge voltage value being increased as a function of the state of ageing of said Li-ion battery up to a limit value in order to provide a constant minimum required energy level in said Li-ion battery, for a reference temperature of, for example, 20° C.

These processing means are in this case the core of a processor.

The device 13 comprises means of transmitting the signal (not shown) to a charger, which are in this case for example an output pin.

EXAMPLE

This example shows the managing of the charging of a Li-ion battery for providing 22 kWh of energy available in the battery which is constant for a temperature of 25° C.

The following values are considered: $V_{EndOfCharge}^{cut-Off}=4.08V$ and the nominal cell unbalance=20 mV, the state of health of the battery being 100% (new battery).

In other words, $V_{EndOfCharge}^{cut-Off}$ has been fixed in order to ensure 22 kWh of energy available in the battery, for a nominal unbalance of 20 mV, that is to say: $V_{cell}^{min}=4.06V$. The following is also considered: $V_{EndOfCharge}^{cut-Off-MAX}=4.10V$ and $V_{EndOfCharge}^{cut-Off-MIN}=4.06V$.

a) If the cell unbalance is such that: $\Delta V_{cell}=10$ mV, then:
According to the prior art, the charging of the battery will be stopped at $V_{cell}^{max}=4.08V$ (and $V_{cell}^{min}=4.07V$). The user will have more than 22 kWh of available energy and the battery will have been uselessly overcharged.
According to the invention, the charging of the battery will be stopped at $V_{cell}^{max}=4.07V$ (and $V_{cell}^{min}=4.06V$). There will be exactly 22 kWh of available energy, whilst limiting the maximum cell voltage.

b) If the cell unbalance is such that: $\Delta V_{cell}=20$ mV, then:
According to the prior art, the charging of the battery will be stopped at $V_{cell}^{max}=4.08V$ (and $V_{cell}^{min}=4.06V$).
According to the invention, the charging of the battery will be stopped at $V_{cell}^{max}=4.08V$ (and $V_{cell}^{min}=4.06V$).
The two results are identical.

c) If the cell unbalance is such that: $\Delta V_{cell}=40$ mV then:
According to the prior art, the charging of the battery will be stopped at $V_{cell}^{max}=4.08V$ (and $V_{cell}^{min}=4.04V$). The user will not benefit from an available energy of 22 kWh, which will be lower.
According to the invention, the charging of the battery will be stopped at $V_{cell}^{max}=4.10V$ (and $V_{cell}^{min}=4.06V$). There will be exactly 22 kWh of available energy in the battery, without however fixing too high a value of maximum cell voltage.

d) If the cell unbalance is such that: $\Delta V_{cell}=50$ mV, then:
According to the prior art, the charging of the battery will be stopped at $V_{cell}^{max}=4.08V$ (and $V_{cell}^{min}=4.03V$). The user will not benefit from an available energy of 22 kWh, which will be lower.
According to the invention, the charging of the battery will be stopped at $V_{cell}^{max}=4.10V$ (and $V_{cell}^{min}=4.06V$). There will be a little less than 22 kWh of energy available in the battery, without however fixing too high a value of maximum cell voltage.

The invention claimed is:

1. A method for managing charging of a Li-ion battery as a function of at least one parameter chosen from a group comprising a state of ageing of the Li-ion battery and cell unbalance representing a difference between a state of charge of a cell exhibiting a highest charge and another state of charge of a cell exhibiting a lowest charge, the method comprising the following steps:
   a) determining an end-of-charge voltage value of said Li-ion battery; and
   b) generating a control signal controlling charging of said Li-ion battery and transmitting the control signal to a charger, the control signal being generated in a way that the Li-ion battery is charged as a function of the end-of-charge voltage value determined in step a), said end-of-charge voltage value being increased as a function of the state of ageing of said Li-ion battery until a limit value is reached in order to ensure a constant minimum required energy level in said Li-ion battery is provided at a predetermined reference temperature.

2. The method as claimed in claim 1, prior to step a), further comprising a step of generating and processing a signal of evaluation of the state of ageing of the Li-ion battery.

3. The method as claimed in claim 1, after step b), further comprising a step of generating and processing an end-of-charge signal when a maximum cell voltage value is greater than or equal to the end-of-charge voltage value and when an authorized charging power in the Li-ion battery is less than or equal to a maximum authorized end-of-charge power.

4. The method as claimed in claim 1, in step b), further comprising a step c) of generating and processing a modulation signal of said end-of-charge voltage value, and the modulation signal is increased as a function of the cell unbalance.

5. The method as claimed in claim 4, in step a), wherein the determining an end-of-charge voltage value consists of determining a cut-off voltage for an end-of-charge on a maximum cell voltage and a cut-off voltage for another end-of-charge on a minimum cell voltage as a function of the state of ageing of the Li-ion battery.

6. The method as claimed in claim 4, after step c), further comprising a step of receiving and processing an end-of-charge signal when an authorized charging power in the Li-ion battery is less than or equal to a maximum authorized end-of-charge power and when a maximum cell voltage value is greater than or equal to an end-of-charge cut-off voltage on the maximum cell voltage or when the minimum cell voltage is greater than or equal to the end-of-charge cut-off voltage on the minimum cell voltage.

7. A device for managing charging of a Li-ion battery as a function of at least one parameter chosen from a group consisting of a state of ageing of the Li-ion battery and a cell unbalance representing a difference between a state of charge of a cell exhibiting a highest charge and another state of charge of a cell exhibiting a lowest charge, the device comprising:
   1) a means of determining an end-of-charge voltage value of said Li-ion battery;
   2) a processing means arranged to generate a control signal for controlling the charging of said Li-ion battery; and
   3) a means of transmitting the control signal to a charger;

wherein the processing means is arranged so that the control signal is generated in such a way that the charging of the Li-ion battery is carried out as a function of the determined end-of-charge voltage value, said determined end-of-charge voltage value being increased as a function of an increasing the state of ageing of said Li-ion battery up to a limit value in order to provide a constant minimum required energy level in said Li-ion battery at a predetermined reference temperature.

8. The device as claimed in claim 7, further comprising a means of generating and processing a signal of evaluation of the state of ageing of the Li-ion battery, and the means of determining the end of charge voltage value is arranged to determine a cut-off voltage for the end-of-charge voltage value on a maximum cell voltage and a cut-off voltage for the end-of-charge voltage value on a minimum cell voltage as a function of the state of ageing of the Li-ion battery.

9. A Li-ion battery assembly comprising the Li-ion battery and the device for managing charging as claimed in claim 7.

10. A motor vehicle incorporating the Li-ion battery assembly as claimed in claim 9.

* * * * *